United States Patent [19]

Miyauchi et al.

[11] Patent Number: 5,482,735
[45] Date of Patent: Jan. 9, 1996

[54] METHOD FOR MAKING MULTI-LAYER CERAMIC PACKAGES

[75] Inventors: Nobuaki Miyauchi; Takatoshi Irie, both of San Diego, Calif.

[73] Assignee: Kyocera America, Inc., San Diego, Calif.

[21] Appl. No.: 300,314

[22] Filed: Sep. 2, 1994

Related U.S. Application Data

[62] Division of Ser. No. 739,599, Jul. 29, 1991, Pat. No. 5,345,038.

[51] Int. Cl.⁶ .................................................... B05D 5/12
[52] U.S. Cl. ........................ 427/58; 427/96; 427/125; 174/52.1; 29/25.35
[58] Field of Search ............................ 427/96, 58, 118, 427/125, 402, 443.1; 174/52; 29/25.35

[56] References Cited

U.S. PATENT DOCUMENTS

| | | | |
|---|---|---|---|
| 3,634,600 | 1/1972 | Griffin et al. | 174/525 |
| 3,941,916 | 3/1976 | Morse | 174/52 |
| 4,137,628 | 2/1979 | Suzuki | 29/625 |
| 4,465,742 | 8/1984 | Nagashima et al. | 428/621 |
| 4,675,243 | 6/1987 | Obinata et al. | 428/210 |
| 5,080,980 | 1/1992 | Sakaguchi et al. | 428/610 |

*Primary Examiner*—Shrive Beck
*Assistant Examiner*—Brian K. Talbot
*Attorney, Agent, or Firm*—Loeb and Loeb

[57] ABSTRACT

A method for making multi-layer ceramic packages. The method provides for attaching contact pins to a ceramic substrate after the application of an intermediate metal layer and an outer metal layer. This eliminates plating the contact pins with an intermediate metal layer and an outer metal layer, thereby saving material and process time.

9 Claims, 1 Drawing Sheet

METHOD FOR MAKING MULTI-LAYER CERAMIC PACKAGES

This is a division of application Ser. No. 07/739,599, filed on Jul. 29, 1991 now U.S. Pat. No. 5,345,038.

BACKGROUND OF THE INVENTION

1. Field of the Invention

This invention relates generally to integrated circuit packages, and more particularly to a method for making multi-layer ceramic packages by attaching contact pins to a ceramic substrate after the application of an intermediate metal layer and an outer metal layer to the multi-layer ceramic package.

2. Related Art

In the electronics industry, integrated circuits are commonly encased in packages made of plastic or ceramic. A ceramic integrated circuit package comprises a ceramic substrate including contact pins to connect an integrated circuit enclosed within the package to external circuitry. The package is hermetically sealed (for example, with a ceramic lid).

Fabricating a ceramic integrated circuit package requires a number of steps in order to properly adhere conductive metal patterns and contacts to the ceramic package. Such metal patterns and contacts are necessary in order to provide electrical paths between external circuitry and an integrated circuit package affixed within the ceramic package.

Typically, a metal such as tungsten is used to form metallic wire bonding areas, die attach area, and external bonding pads on the ceramic. Tungsten is known to directly adhere to ceramic materials. However, other materials known in the art can be used in place of tungsten.

In order to provide corrosion resistance, it is highly desirable to coat or plate tungsten wire bonding areas, die attach area, and external bonding pads with an inert metal, such as gold. However, gold does not readily adhere directly to tungsten. Therefore, it is common to use an intermediate metallic layer, such as nickel, to plate tungsten bonding areas and then to overplate the intermediate layer with gold.

The current method of making multi-layer ceramic packages, as illustrated in FIG. 1, consists of five basic steps:

step 1: firing a ceramic substrate 10 with metallized (e.g., tungsten) sealing pad area 11, wire bonding areas 12, die attach area 13, and external bonding pads 14 (FIG. 1A);

step 2: plating the sealing pad area 11, wire bonding areas 12, die attach area 13, and external bonding pads 14 with a first intermediate metal layer A (e.g., nickel) (FIG. 1B);

step 3: brazing contact pins 15 to the plated external bonding pads 14 on the ceramic substrate 10 (FIG. 1C);

step 4: plating the metallic portions of the ceramic substrate 10, including the contact pins 15, with a second intermediate metal layer B (e.g., nickel) to promote adhesion of a subsequent layer of gold (FIG. 1D);

step 5: plating the metallic portions of the ceramic substrate 10, including the contact pins 15, with an outer metal layer C (e.g., gold) (FIG. 1E).

The resulting package has an intermediate metal layer B and an outer metal layer C on the contact pins 15, which may not be necessary for subsequent solder dipping operations. In such a case, this extra plating step costs a considerable amount due to the material and handling costs. The cost is especially significant since the number of contact pins that a multi-layer ceramic package contains has increased in the past few years from 18–24 pins to over 100 pins.

Therefore, it is desirable to provide a method for making multi-layer ceramic packages that reduces the amount of metal plating on contact pins. The present invention accomplishes this goal.

SUMMARY OF THE INVENTION

An object of this invention is to save the considerable material cost involved with plating contact pins of a multi-layer ceramic package with an intermediate metal layer and an outer metal layer.

Another object of this invention is to eliminate the additional handling cost of such a plating step.

The above and other objects of this invention are achieved through a method of attaching contact pins to a ceramic substrate after the application of an intermediate metal layer and an outer metal layer to external bonding pads. This eliminates the plating of an intermediate metal layer and an outer metal layer over the contact pins.

BRIEF DESCRIPTION OF THE DRAWINGS

Like reference numbers in the various drawings refer to like elements.

DETAILED DESCRIPTION OF THE INVENTION

Figure 1A:
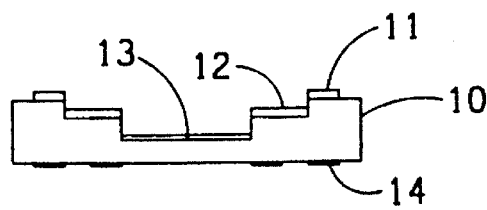
FIGS. 1A, 1B, 1C, 1D and 1E illustrate a method of making multi-layer ceramic packages according to the prior art.
Figure 2A:
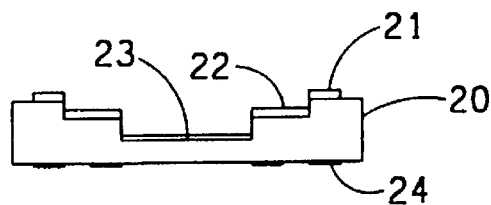
FIGS. 2A, 2B, 2C and 2D illustrate the method of making multi-layer ceramic packages according to this invention.
Figure 1B:
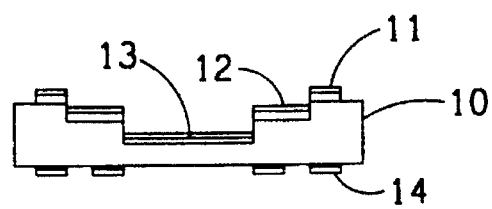
Figure 2B:
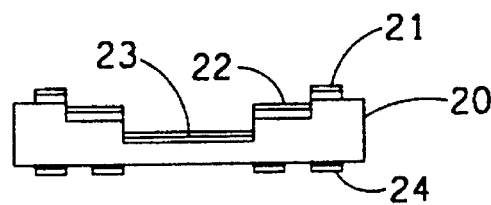
Figure 1C:
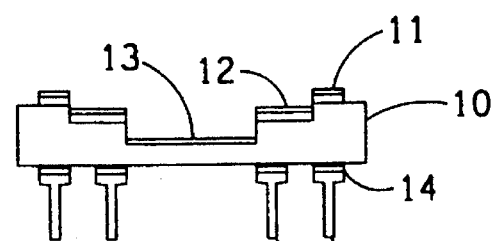
Figure 2C:
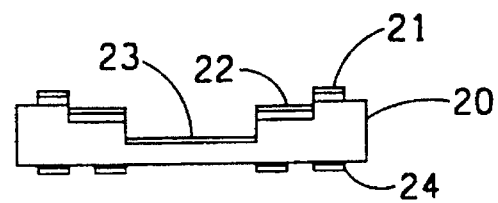
Figure 1D:
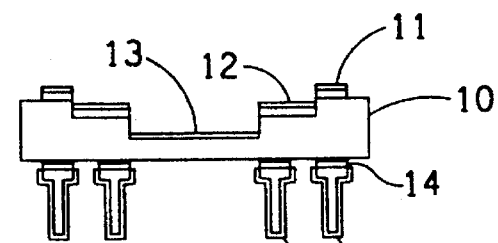
Figure 2D:
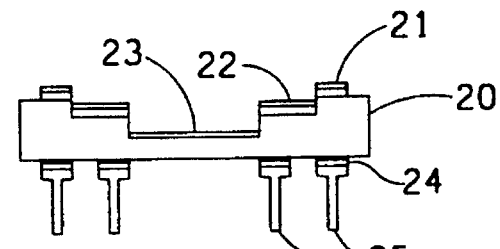
Figure 1E:
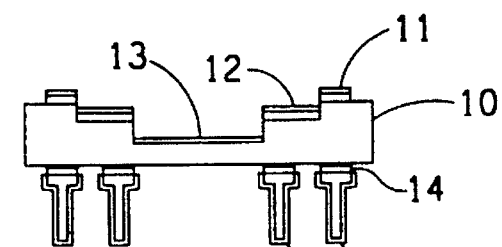

FIG. 2 illustrates the inventive method of making multi-layer ceramic packages. It consists of four principal steps:

step 1: firing a ceramic substrate 20 with metallized (e.g., tungsten) sealing pad area 21, wire bonding areas 22, die attach area 23, and external bonding pads 24 (FIG. 2A);

step 2: plating the sealing pad area 21, wire bonding areas 22, die attach area 23, and external bonding pads 24 with an intermediate metal layer A (e.g., nickel) (FIG. 2B);

step 3: plating the sealing pad area 21, wire bonding areas 22, die attach area 23, and external bonding pads 24 with an outer relatively inert metal layer C (e.g., gold) (FIG. 2C);

step 4: brazing contact pins 25 to the plated external bonding pads 24 on the ceramic substrate 20 (FIG. 2D).

Optionally, between steps 2 and 3, the process may include the step of printing NiO on the external bonding pads 24 and sintering to reduce the NiO to Ni metal. Inclusion of this step provides more nickel on the external bonding pads 24, which improves solderability of the external bonding pads 24 when other components are soldered thereto at a later stage. In some cases, this printing step may be performed in lieu of plating step 2.

The multi-layer ceramic package described in this invention contrasts with the prior art in that the contact pins 25 are not plated. This is achieved by eliminating the second intermediate metal layer plating step (FIG. 1, step 4) after the brazing operation (FIG. 1, step 3) by plating the outer metal layer before the brazing operation. By not unnecessarily plating the contact pins 25 with gold, the invention saves a considerable amount of material and handling costs in fabricating multi-layer ceramic packages.

Although this invention has been described by a single embodiment thereof, it should be realized that many alternatives, modifications and variations will be apparent to those skilled in the art of the foregoing description. Accordingly, it is intended to embrace all such alternatives, modifications and variations as falling within the spirit and broad scope of the appended claims.

We claim:

1. A method of making a multi-layer ceramic package having a ceramic substrate, metallic wire bonding areas, die attach area, and external bonding pads, the method comprising the steps of:
    a. plating the wire bonding areas, die attach area, and external bonding pads with an intermediate metal layer;
    b. coating the plated wire bonding areas, die attach area, and external bonding pads with an outer metal layer; and
    c. brazing contact pins to the outer metal layer coated on the external bonding pads on the ceramic substrate.

2. A method for making a ceramic package, comprising the steps of:
    a. forming a ceramic substrate with metallized wire bonding areas, die attach area, and external bonding pads;
    b. coating the wire bonding areas, die attach area, and external bonding pads with an intermediate metal layer;
    c. plating the coated wire bonding areas, die attach area, and external bonding pads with an outer metal layer; and
    d. brazing contact pins to the outer metal layer plated on the external bonding pads on the ceramic substrate.

3. The invention of claim 2 wherein the metallized areas and pads comprise tungsten.

4. The invention of claims 1 or 2, wherein the intermediate metal layer comprises nickel.

5. The invention of claims 1 or 2, wherein the step of coating comprises plating.

6. The invention of claim 5, further including the step of printing a metallic compound containing the intermediate metal layer over the plated intermediate metal layer, and reducing the printed compound to substantially the intermediate metal.

7. The invention of claims 1 or 2, wherein the step of coating comprises the steps of printing a metallic compound containing the intermediate metal and reducing the printed compound to form the intermediate metal layer.

8. The invention of claims 1 or 2, wherein the outer metal layer comprises an inert metal.

9. The invention of claim 8, wherein the inert metal is gold.

* * * * *